US010720924B2

(12) United States Patent
Pillonnet et al.

(10) Patent No.: US 10,720,924 B2
(45) Date of Patent: Jul. 21, 2020

(54) ADIABATIC LOGIC CELL

(71) Applicant: Commissariat à l'Énergie Atomique et aux Énergies Alternatives, Paris (FR)

(72) Inventors: Gaël Pillonnet, Grenoble (FR); Hervé Fanet, Revel (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/673,677

(22) Filed: Nov. 4, 2019

(65) Prior Publication Data

US 2020/0153433 A1 May 14, 2020

(30) Foreign Application Priority Data

Nov. 9, 2018 (FR) ...................................... 1871437

(51) Int. Cl.
*H03K 19/00* (2006.01)
*H03K 19/094* (2006.01)
*H03K 19/0185* (2006.01)

(52) U.S. Cl.
CPC . *H03K 19/0019* (2013.01); *H03K 19/018521* (2013.01); *H03K 19/018571* (2013.01); *H03K 19/0941* (2013.01)

(58) Field of Classification Search
CPC ....... H03K 19/0019; H03K 19/018521; H03K 19/018571; H03K 19/0941
See application file for complete search history.

(56) References Cited

U.S. PATENT DOCUMENTS

| 5,422,582 | A | * | 6/1995 | Avery | ............... | H03K 19/0019 |
| | | | | | | 326/136 |
| 6,242,951 | B1 | * | 6/2001 | Nakata | .................... | G06F 7/505 |
| | | | | | | 326/113 |
| 6,580,293 | B1 | * | 6/2003 | Bernstein | ........... | H03K 19/0963 |
| | | | | | | 326/115 |
| 2008/0203443 | A1 | * | 8/2008 | Wilson | ................... | G11C 11/22 |
| | | | | | | 257/260 |
| 2014/0340958 | A1 | * | 11/2014 | Gharia | .................. | G11C 11/161 |
| | | | | | | 365/158 |

OTHER PUBLICATIONS

Preliminary Search Report for French Application No. 1871437, dated May 24, 2019.
Kumar et al., FinSAL: a novel FinFET based secure adiabatic logic for energy-efficient and DPA resistant IoT devices. IEEE 2016 International Conference on Rebooting Computing (ICRC). Oct. 17, 2016:1-8.
Rao et al., FinFET based adiabatic logic design for low power applications. IEEE 2017 International Conference on Microelectronic Devices, Circuits and Systems. Aug. 10, 2017:1-6.

* cited by examiner

*Primary Examiner* — Alexander H Taningco
*Assistant Examiner* — Kurtis R Bahr
(74) *Attorney, Agent, or Firm* — Wolf, Greenfield & Sacks, P.C.

(57) ABSTRACT

An adiabatic logic cell including a first MOS transistor coupling a node for applying a periodic variable supply voltage of the cell to a floating node for providing an output logic signal of the cell, wherein the first transistor is a dual-gate transistor including a front gate coupled to a node for applying an input logic signal of the cell, and a back gate coupled to a node for applying a first periodic variable bias voltage.

17 Claims, 5 Drawing Sheets

ADIABATIC LOGIC CELL

This application claims priority to French Patent application number 18/71437, filed on Nov. 9, 2018, the content of which is hereby incorporated by reference in its entirety to the maximum extent allowable by law.

TECHNICAL FIELD

The present disclosure relates to the field of integrated circuits comprising cells implementing logic functions, also known as logic cells or logic gates. The present disclosure relates more specifically to low-consumption logic cells and an integrated circuit comprising such logic cells.

BACKGROUND ART

The logic circuits of the prior art are generally realised based on field-effect transistors, for example using CMOS (Complementary Metal-Oxide Semiconductor) technology, which associates two types of complementary MOS transistors, one of the n type, the other of the p type, on a same support.

FIG. 1 is a circuit diagram of an example of an inverting logic cell 100, i.e. performing the NO base function, using CMOS technology. The cell 100 comprises an association in series of an N-channel MOS transistor T1 and a P-channel MOS transistor T2 between a node GND for applying a reference potential of the circuit (for example, ground) and a node for applying a DC supply voltage VDD referenced with respect to the node GND. More specifically, the transistor T1 has its source connected to the node GND and its drain connected to the drain of the transistor T2, and the transistor T2 has its source connected to the node a1. The gates of the transistors T1 and T2 are connected to a same node e1 for applying an input logic signal VIN1. The drains of the transistors T1 and T2 are connected to a same node s1 for providing an output logic signal VOUT1. In this example, the input signal VIN1 and the output signal VOUT1 are voltages referenced with respect to the node GND. In FIG. 1, a capacitor CL connected between the output node s1 and the reference node GND has been illustrated, representing the output capacitance of the cell.

The operation of the inverter 100 shown in FIG. 1 is as follows. When the input signal VIN1 is in the high state, for example at a value close to the supply voltage VDD, the transistor T2 is off and the transistor T1 is on. As a result, the signal VOUT1 is maintained in a low state, close to 0 volt. When the input signal VIN1 is a low state, for example at a value close to 0 volt, the transistor T1 is off and the transistor T2 is on. As a result, the signal VOUT1 is maintained in a high state, close to VDD. The cell shown in FIG. 1 thus performs the function of an inverter, i.e. the output logic signal VOUT1 is equal to the complement of the input logic signal VIN.

More generally, all the basic logic functions conventionally used in integrated circuits can be realised by cells having architectures of the same type as the one shown in FIG. 1, i.e. comprising field-effect transistors mounted as resistor voltage divider bridges.

The logic cells of this type, however, have limitations in terms of electrical energy consumption. In particular, it can be shown that a cell of the type described in relation to FIG. 1 dissipates, each time the state of its input signal changes, a quantity of energy E given by the relation:

$$E = 0{,}5 * CL * VDD^2 \quad \text{[Math 1]}$$

In order to reduce the dynamic consumption of the cells, it is possible to try to reduce their supply voltage VDD. However, in practice, the reduction of the supply voltage is accompanied by a decrease in the threshold voltages of the transistors and consequently by an increase in the leakage currents in the transistors, and thus in the static consumption of the cells.

Another type of logic cells, known as adiabatic, have been proposed in order to reduce the consumption of the cells. In adiabatic logic, rather than abruptly charging and discharging the output capacitances CL of the cells each time their state changes, which is the case in classic logic, an effort is made to effect the charging and discharging of the capacitances CL in a gradual manner. For this purpose, the DC supply voltage VDD used in classic logic is replaced by a periodic variable supply voltage. The adiabatic logic is a dynamic logic, i.e. the output states of the logic cells are only available during a fraction of the period of the clock signal formed by the periodic variable supply voltage. If one designates the duration of charging or discharging the capacitances CL by T, the resistance of the transistor T1 or T2 used to charge or discharge the capacitance CL by RT, and if a periodic supply voltage varying from 0 volt to VDD is considered, it can be shown, as a first approximation (by considering the duration T to be much greater than the time constant RT*CL of the cells), that the quantity of energy E dissipated during a change of state of a cell is expressed by the relation:

$$E = CL * VDD^2 * \frac{2 * RT * CL}{T} \quad \text{[Math 2]}$$

Thus, if the duration T of charging and discharging the capacitances CL of the cells (corresponding to the time of increase from 0 volt to VDD or of decrease from VDD to 0 volt of the supply voltage) is chosen to be high enough with respect to the time constant RT*CL of the cells, the energy dissipated at each change of state can be reduced in a meaningful manner compared to classic logic circuits of the type described in relation to FIG. 1.

In practice, the adiabatic logic circuits realised using CMOS technology also have limitations in terms of consumption. In particular, in a MOS transistor usually having a non-zero threshold voltage, a residual non-adiabatic energy dissipation inevitably persists at each switching of the transistors of the cell. The reduction of the threshold voltage of the transistors in advanced CMOS technologies makes it possible to reduce this non-adiabatic dynamic dissipation, but is generally accompanied by an increase in the leakage currents, and thus in the static consumption of the cells, which remains significant due to the relatively low frequency of the periodic variable supply voltage.

SUMMARY OF INVENTION

An object of one embodiment is to address all or some of the drawbacks of known adiabatic logic cells.

For this purpose, one embodiment provides an adiabatic logic cell comprising a first MOS transistor coupling a node for applying a periodic variable supply voltage of the cell to a floating node for providing an output logic signal of the cell, wherein the first transistor is a dual-gate transistor comprising a front gate coupled to a node for applying an input logic signal of the cell, and a back gate coupled to a node for applying a first periodic variable bias voltage, wherein the periodic variable bias voltage and the periodic variable supply voltage have substantially the same frequency and the same form, and wherein the periodic variable bias voltage varies substantially in phase or in phase opposition with the periodic variable supply voltage.

According to an embodiment, the periodic variable bias voltage is chosen so that the first transistor has a threshold voltage varying in a periodic manner, substantially at the same frequency as the periodic variable supply voltage, and has a maximum value when the periodic variable supply voltage has a maximum value, and a minimum threshold when the periodic variable supply voltage has a minimum value.

According to an embodiment, the periodic variable bias voltage and the periodic variable supply voltage have substantially the same frequency.

According to an embodiment, the periodic variable bias voltage varies in phase or in phase opposition with the periodic variable supply voltage.

According to an embodiment, the cell further comprises a maintaining circuit connected between the node for applying the supply voltage and the floating node of the cell.

According to an embodiment, the maintaining circuit comprises a MOS transistor coupling, via its conduction nodes, the supply-voltage node to the floating node of the cell.

According to an embodiment, the cell further comprises a restarting circuit connected between the floating node and a node for applying a reference potential of the cell.

According to an embodiment, the restarting circuit comprises a MOS transistor coupling, via its conduction nodes, the floating node to the node for applying the reference potential of the cell.

According to an embodiment, the cell further comprises a first additional MOS transistor coupling the supply-voltage node to an additional floating node for providing a complementary output logic signal of the cell, the first additional MOS transistor being a dual-gate transistor comprising a front gate coupled to a node for applying a complementary input logic signal of the cell, and a back gate coupled to the node for applying the first bias voltage for biasing the cell.

According to an embodiment, the cell further comprises an additional maintaining circuit, the additional maintaining circuit comprising a MOS transistor coupling, via its conduction nodes, the supply-voltage node to the additional floating node of the cell.

According to an embodiment, the transistor of the maintaining circuit has a front gate connected to the additional floating node of the cell and the transistor of the additional maintaining circuit has a front gate connected to the floating node of the cell.

According to an embodiment, the first transistor and the first additional transistor of the cell are of the same conductivity type, and the transistor of the maintaining circuit and the transistor of the additional maintaining circuit are of a conductivity type opposite that of the first transistor and of the first additional transistor.

According to an embodiment, the transistor of the maintaining circuit and the transistor of the additional maintaining circuit are dual-gate transistors having a back gate coupled to a node for applying a second periodic variable bias voltage.

According to an embodiment, the cell further comprises an additional restarting circuit, the additional restarting circuit comprising a MOS transistor coupling, via its conduction nodes, the additional floating node to the node for applying the reference potential of the cell.

According to an embodiment, the transistor of the restarting circuit has a front gate connected to the additional floating node of the cell and the transistor of the additional restarting circuit has a front gate connected to the floating node of the cell.

According to an embodiment, the transistor of the restarting circuit and the transistor of the additional restarting circuit are dual-gate transistors each having a back gate coupled to the node for applying the first bias voltage for biasing the cell.

A further embodiment provides a logic circuit comprising a first logic cell as defined above and a second logic cell as defined above cascaded in series with the first cell, the first cell having its floating node connected to the node for applying the input logic signal of the second cell.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the uses that can be made of the described elementary logic cells have not been described in detail, the described embodiments being compatible with the conventional uses of elementary logic cells in electronic circuits. In addition, the realisation of the different components, and in particular of the transistors, of the described cells, have not been described in detail, the described embodiments being compatible with the known techniques for realising MOS transistors.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

Unless specified otherwise, the expressions "around", "approximately", "substantially" and "in the order of" signify within 10%, and preferably within 5%.

In the described examples, the input and output logic signals of a logic cell correspond to voltages referenced with respect to a reference node GND of the cell, the level of which determines the value, high or low, of the logic signal. Unless indicated otherwise, a logic signal is understood to be a signal that can only have two values, a high value, corresponding, for example, to a voltage close to the supply voltage of the cell, or a low value, corresponding, for example, to a voltage close to 0 volt. The realisation of adiabatic logic cells is more specifically of interest here. In this case, the supply voltage of each cell is a periodic variable voltage, and the input and output logic signals of each cell correspond to variable or AC voltages of the same frequency as the supply voltage, the amplitude of which determines the value, high or low, of the logic signal. For instance, a logic signal is said to be in the high state (logical 1) when the amplitude of the corresponding voltage is close to the amplitude of the supply voltage of the cell, for example comprised between 1 and 10 volts, and in the low state (logical 0) when the amplitude of the corresponding voltage is close to 0 volt, for example lower than 0.5 volt.

Figure 1:
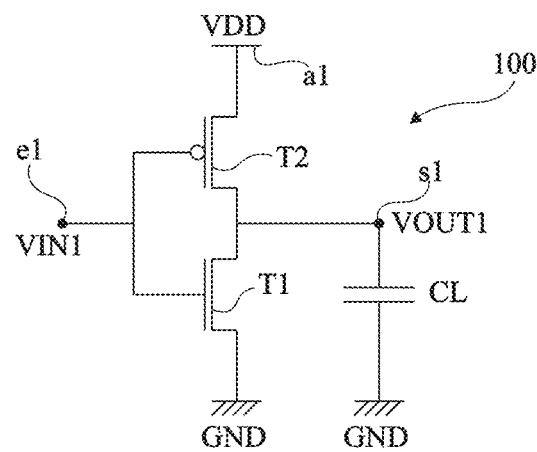
FIG. 1, which was described in the foregoing, is a circuit diagram of an example of a static logic cell.
Figure 2:
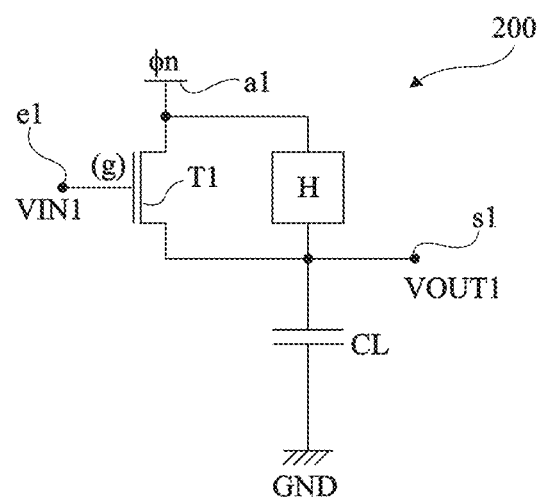
FIG. 2 is a circuit diagram of an example of an adiabatic logic cell.

FIG. 2 is a circuit diagram of an example of an adiabatic logic cell 200 of the buffer type.

The cell 200 comprises an N-channel MOS transistor coupling, via its conduction nodes, a node a1 for applying a periodic variable supply voltage $\phi n$ for supplying the cell, to a node s1 for providing an output voltage VOUT1 of the cell. More specifically, the transistor T1 has its drain coupled, for example connected, to the node a1 and its source coupled, for example connected, to the node s1. The gate (g) of the transistor T1 is coupled, for example connected, to a node e1 for applying an input voltage VIN1 of the cell. In FIG. 2, a capacitor CL connected between the output node s1 and the reference node GND has been illustrated, representing the output capacitance of the cell. For instance, the output capacitance CL does not correspond to a component specifically realised and connected to the output node s1 of the cell, but represents the sum of the parasitic capacitances of the various elements connected to the node s1, in particular of the interconnecting tracks, of the transistor T1, or a further logic cell (not illustrated) the input of which is connected to the node s1. In this example, the supply voltage $\phi n$ is referenced with respect to the node GND. In addition, in this example, the input voltage VIN1 and the output voltage VOUT1 are variable voltages of the same frequency as the voltage $\phi n$, referenced with respect to the node GND.

In the example shown in FIG. 2, the buffer cell 200 further comprises a maintaining circuit H adapted to maintain the output voltage VOUT1 of the cell at a high level during transition phases of the input voltage VIN1 from a high level to a low level. In this example, the maintaining circuit H is connected on one side to the supply node a1 and on the other side to the output node s1 of the cell.

Figure 3:
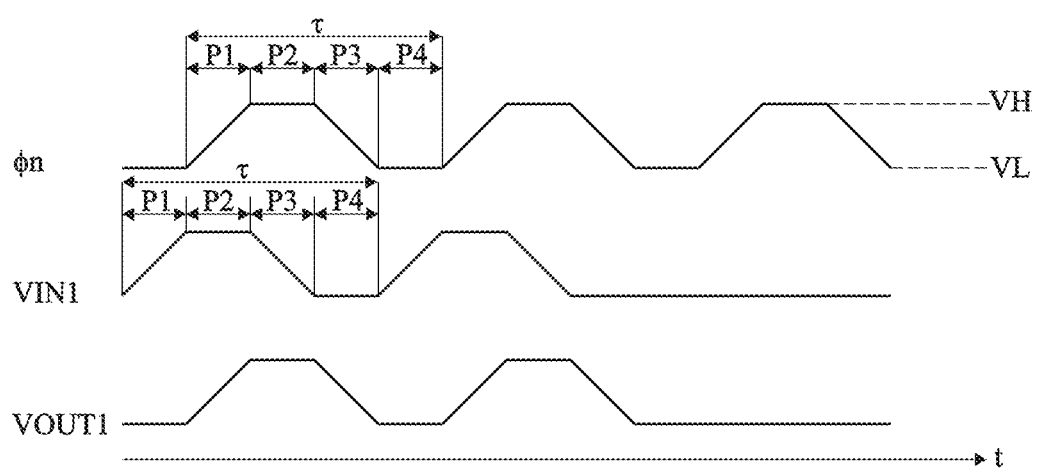
FIG. 3 is a time chart depicting an example of an embodiment of the cell shown in FIG. 2.

FIG. 3 is a time chart depicting the operation of the buffer cell 200 shown in FIG. 2. More specifically, FIG. 3 depicts the progression, as a function of time t (in the abscissa), of the supply voltage $\phi n$, of the input voltage VIN1, and of the output voltage VOUT1 of the cell shown in FIG. 2.

The supply voltage $\phi n$ is a periodic variable voltage, provided by a variable voltage source not illustrated in FIG. 2. The voltage $\phi n$ varies in a periodic and continuous manner between a low value VL, for example comprised between 0 and 2 volts, and a high value VH, for example greater than the value VL by at least 1 volt. In the illustrated example, the supply voltage $\phi n$ is a trapezoidal voltage. More specifically, in this example, each period $\tau$ of the voltage $\phi n$ comprises four successive phases P1, P2, P3 and P4 substantially of the same duration $T=\tau/4$. During the phase P1, the voltage $\phi n$ increases in a linear manner from its low value VL until its high value VH. During the phase P2, the voltage $\phi n$ remains substantially constant and equal to its high value VH. During the phase P3, the voltage $\phi n$ decreases in a linear manner from its high value VH until its low value VL. During the phase P4, the voltage $\phi n$ remains substantially constant and equal to its low value VL.

The voltages VIN1 and VOUT1 are synchronised to the supply voltage $\phi n$, which also acts as a clock signal. The voltages VIN1 and VOUT1 have substantially the same form as the variable supply voltage $\phi n$. The voltages VIN1 and VOUT1 respectively define logic signals IN1 and OUT1. The logic signal IN1, respectively OUT1, is high when the amplitude of the variable voltage VIN1, respectively VOUT1, is at a high level, for example close to the amplitude of the supply voltage $\phi n$, for example substantially equal to the amplitude of the supply voltage $\phi n$ less the threshold voltage VTH of the transistor T1, and is at a low level when the amplitude of the variable voltage VIN1, respectively VOUT1, is at a low level, for example close to 0 volt, for example substantially equal to the threshold voltage VTH in the case where the maintaining circuit is constituted by a transistor identical or similar to the transistor T1, as described in the following in greater detail. The voltage VIN1 has a phase lead in the order of $T=\tau/4$, i.e. $\pi/2$ radians or 90 degrees, with respect to the supply voltage $\phi n$. The voltage VOUT1 is in turn in phase with the supply voltage $\phi n$.

In the example illustrated in FIG. 3, the input logic signal IN1 is high during two successive periods $\tau$ of the supply signal $\phi n$, then becomes low.

For a logical 0 of the input signal IN1 (voltage VIN1 of an amplitude close to 0 volt), the resistance of the transistor T1 has a high value (corresponding, for example, to the resistance in the off state of the transistor) during the four phases P1, P2, P3 and P4 of the voltage VIN1, so that the capacitance CL is not charged or barely charged. The voltage impulse VOUT1 transmitted on the output terminal s1 of the cell is thus at a low level of amplitude, for example close to 0 volt. For a logical 1 of the input signal IN1 (voltage VIN1 of an amplitude close to the amplitude of the supply voltage $\phi n$), the resistance of the transistor T1 decreases until a low value (corresponding, for example, to the resistance in the on state of the transistor) during the phase P1 of the voltage VIN1, remains at a low value during the phase P2 of the voltage VIN1, increases again until a high value during the phase P3 of the voltage VIN1, then remains at a high value during the phase P4 of the voltage VIN1. A voltage impulse VOUT1 is thus obtained on the output terminal s1 of the cell that has a high amplitude level, for example close to the amplitude of the supply voltage $\phi n$. By means of the maintaining circuit H of the cell, it is possible to maintain a relatively low resistance between the supply terminal a1 and the output terminal s1 of the cell, during the decreasing phase of the high-level impulse of the input voltage VIN1

(phase P3 of the voltage VIN1, corresponding to the phase P2 of the voltage φn), which makes it possible to provide as an output of the cell a high-level impulse of the same form (trapezoidal in this example) as the supply voltage φn.

Thus, the cell 200 copies on its output terminal s1 a signal OUT1 having the same logic state as the signal IN1 applied on its input terminal e1.

In the example of a four-phase operation described above, in a logic circuit comprising a plurality of cells cascaded in series, each cell receives, on its supply terminal a1 a periodic variable voltage φn with a phase lag of approximately T=τ/4 with respect to the supply voltage of the preceding cell. This allows, in each cell, the input logic signal of the cell (corresponding to the output logic signal of the preceding cell) to be in phase lead by approximately T=τ/4 with respect to the supply voltage of the cell as depicted in FIG. 3. Thus, in a logic circuit comprising a number greater than or equal to 4 elementary cells cascaded in series, four similar supply voltages φ1, φ2, φ3, φ4 will be provided, i.e. of the same frequency, of the same form and of the same amplitude level, but out of phase in pairs by approximately π/2.

As a variant, the trapezoidal supply voltages φn can be approximated by sinusoidal voltages with the period τ.

A limitation of the cell 200 shown in FIG. 2 is that the transistor T1 has a non-zero threshold voltage VTH, which expresses itself by a residual non-adiabatic energy dissipation at the end of the phase P3 of the supply voltage φn (as a result of a part of the charges not returning toward the supply node a1). Decreasing the threshold voltage of the transistor T1 can make it possible to limit or eliminate this non-adiabatic energy dissipation. However, this leads to an increase in leakages in the transistor T1, and thus in the consumption of energy, during the phase P2 of the supply voltage φn.

Figure 4:
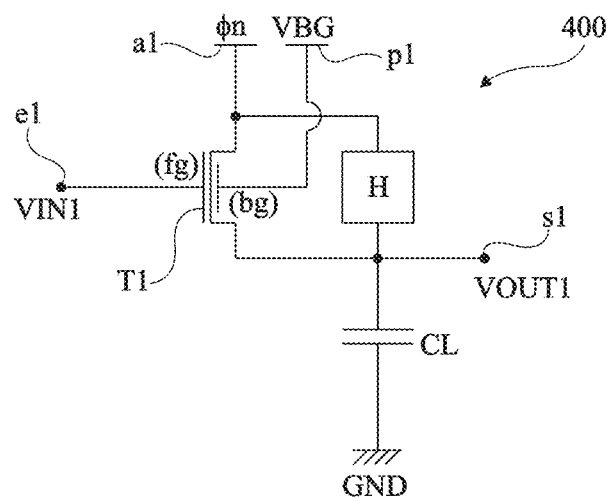
FIG. 4 is a circuit diagram of an example of an adiabatic logic cell according to an embodiment.

FIG. 4 is a circuit diagram of an example of an adiabatic logic cell 400 of the buffer type according to an embodiment.

The cell 400 shown in FIG. 4 differs from the cell 200 shown in FIG. 2 essentially in that, in the cell 400, the transistor T1 is a dual-gate MOS transistor.

By dual-gate MOS transistor, a transistor is understood here that comprises a channel-formation area bordered laterally on one side by a source area and on the other by a drain area, and further comprising a first control gate or front gate (fg), disposed above the channel-formation area and isolated from the channel-formation area by a dielectric layer, and a second control gate or back gate (bg), disposed under the channel-formation area. In such a transistor, the current flowing between the drain and the source of the transistor is a function not only of the potential applied on the front gate of the transistor, but also of the potential applied on its back gate. In particular, the threshold voltage of the transistor, i.e. the minimum voltage to be applied between the front gate and the source of the transistor for turning the transistor on, depends on the potential applied on the back gate of the transistor.

The transistor T1 is, for example, a transistor of the SOI type (Semiconductor On Insulator), the back gate thus being isolated from the channel-formation area by a dielectric layer. Preferably, the transistor T1 is a transistor of the FDSOI type (Fully Depleted Semiconductor On Insulator), i.e. an SOI transistor in which the channel-formation area is entirely depleted in the absence of a bias of the transistor. Indeed, in an FDSOI transistor, the variations in the control potential applied on the back gate of the transistor cause significant variations in the threshold voltage of the transistor, which is particularly adapted to the implementation of the embodiments yet to be described, as will become more readily apparent in the following description. The described embodiments are not limited, however, to cases where the transistor T1 is of the SOI or FDSOI type. More generally, the described embodiments apply to all types of control dual-gate MOS transistors respectively arranged on the side of the front and on the side of the back of the channel-formation area of the transistor. For instance, the described embodiments are compatible with MOS transistors of the "bulk" type, comprising an area of semiconducting body disposed under the channel-formation area, the upper of which is in contact with the lower of the channel-formation area. In this case, the back gate is constituted by the body area of the transistor, and is not isolated from the channel-formation area. As a variant, the transistor T1 can be a transistor of the FinFET type (or fin transistor).

The assembly of the transistor T1 shown in FIG. 4 is similar to what has been described in relation to FIG. 2, by replacing the gate (g) of the transistor T1 of the cell shown in FIG. 2 with the front gate (fg) of the transistor T1 in the cell shown in FIG. 4.

In the cell 400, the back gate (bg) of the transistor T1 is coupled, for example connected, to a node p1 for applying a periodic variable bias voltage VBG, of substantially the same frequency as the supply voltage φn of the cell. By means of the bias voltage VBG, it is possible to modulate the threshold voltage of the transistor T1, substantially at the same frequency as the supply voltage φn of the cell. More specifically, the bias voltage VBG is chosen so that the threshold voltage VTH of the transistor T1 has a relatively high value VTHMAX during the phase P2 of the supply voltage φn of the cell, and a relatively low value VTHMIN during the phase P4 of the supply voltage φn of the cell. Preferably, the bias voltage VBG is a continuous (or gradual) variation voltage, so that the threshold voltage VTH varies in a continuous manner, for example in a substantially linear manner, from the high value VTHMAX to the low value VTHMIN during the phase P3 of the supply voltage φn, and from the low value VTHMIN to the high value VTHMAX during the phase P1 of the supply voltage φn of the cell. This allows the attainment of an adiabatic charging and discharging of the back gate, so as to avoid any additional dynamic loss. For instance, the bias voltage VBG has substantially the same form, for example trapezoidal or sinusoidal, as the supply voltage φn.

Figure 5:
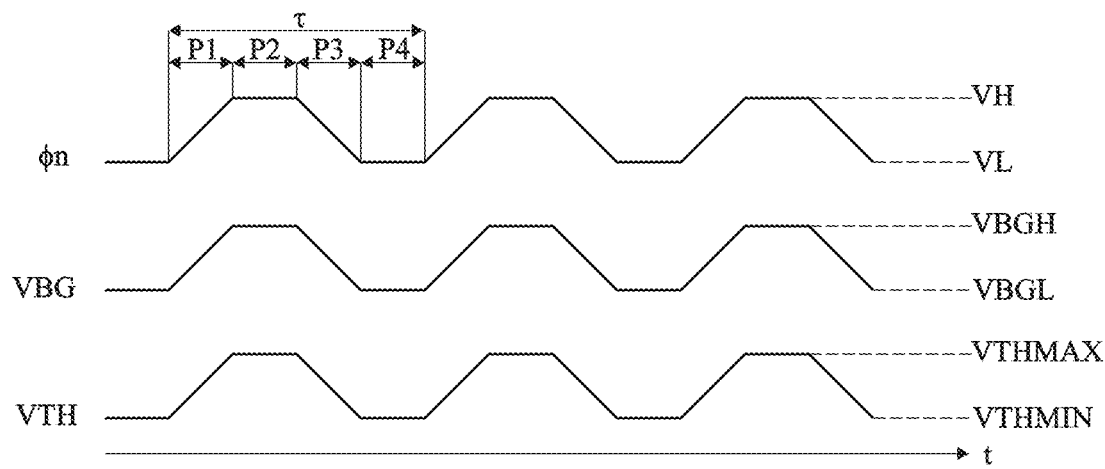
FIG. 5 is a time chart depicting an example of an embodiment of the cell shown in FIG. 4.

FIG. 5 is a time chart depicting an example of an embodiment of the buffer cell 400 shown in FIG. 4. More specifically, FIG. 5 depicts the progression, as a function of time t (in the abscissa), of the supply voltage φn, of the bias voltage VBG applied on the node p1 of the cell, and of the threshold voltage VTH of the transistor T1 of the cell. In this example, the supply voltage φn of the cell 400 is identical or similar to the supply voltage φn of the cell 200. For the sake of simplification, the input voltage VIN1 and the output voltage VOUT1 of the cell have not been illustrated in FIG. 5. The progression of the voltages VIN1 and VOUT1 is, for example, similar to what has been described in relation to FIG. 3. However, this time, the high and low levels of the voltage VOUT1 are no longer limited by the threshold voltage VTH of the transistor T1, or only negligibly.

In this example, the transistor T1 is a transistor with a positive threshold-voltage variation, i.e. the higher the bias voltage VBG applied on the back gate (bg), the higher its threshold voltage VTH. In this case, as is evident from FIG. 5, the bias voltage VBG varies substantially in phase with the supply voltage φn. In practice, a slight phase shift can be present due to potential differences between the rising and/or falling slopes of the bias voltage VBG and the supply voltage φn. Substantially in phase here is thus understood to mean that the phase shift between the bias voltage VBG and the supply voltage φn is relatively small, for example less than 30 degrees and preferably less than 20 degrees as an absolute value.

The voltage VBG can be provided by a variable voltage source, not illustrated in FIG. 4. The voltage VBG varies in a periodic and continuous manner between a low value VBGL, and a high value VBGH. For instance, in cases where the transistor T1 is an FDSOI transistor, and where the high and low values of the supply voltage φn are respectively in the order of 0 volt and in the order of 1 volt, the value VBGL can be comprised between −2 and 0 volt, for example in the order of −0.5 volt, and the value VBGH can be greater by at least 1 volt than the low value VBGL, for example comprised between 1 and 4 volts, for example in the order of 2 volts. In the illustrated example, the voltage VBG is a trapezoidal voltage substantially of the same form as the supply voltage φn and in phase with the supply voltage φn. More specifically, in this example, during the phase P1 of the voltage φn, the voltage VBG increases in a linear fashion from its low value VBGL until its high value VBGH. During the phase P2 of the voltage φn, the voltage VBG remains substantially constant and equal to its high value VBGH. During the phase P3 of the voltage φn, the voltage VBG decreases in a linear fashion from its high value VBGH until its low value VBGL. During the phase P4 of the voltage φn, the voltage VBG remains substantially constant and equal to its low value VBGL. As a result, during the phase P1 of the voltage φn, the threshold voltage VTH of the transistor T1 increases in a linear fashion from its low value VTHMIN until its high value VTHMAX. During the phase P2 of the voltage φn, the voltage VTH remains substantially constant and equal to its high value VTHMAX. During the phase P3 of the voltage φn, the voltage VTH decreases in a linear fashion from its high value VTHMAX until its low value VTHMIN. During the phase P4 of the voltage φn, the voltage VTH remains substantially constant and equal to its low value VTHMIN.

Figure 6:
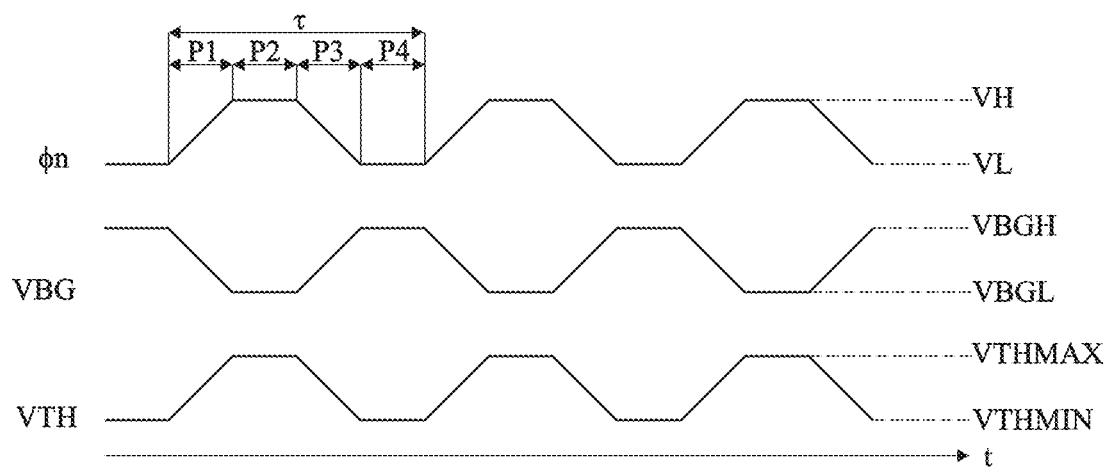
FIG. 6 is a time chart depicting a further example of an embodiment of the cell shown in FIG. 4.

FIG. 6 is a time chart similar to the time chart shown in FIG. 5, depicting an example of an embodiment of the buffer cell 400 shown in FIG. 4 in the case where the transistor T1 is a transistor with a negative threshold-voltage variation, i.e. the higher the bias voltage VBG applied on its rear gate (bg), the lower its threshold voltage VTH. In this case, as is evident from FIG. 6, the bias voltage VBG varies substantially in phase opposition with the supply voltage φn. In practice, a slight phase shift can be present due to potential differences in slopes of incline and/or of decline between the bias voltage VBG and the supply voltage φn. Substantially in phase opposition here is thus understood to mean that the phase shift between the bias voltage VBG and the supply voltage φn is equal to 180 degrees with an accuracy of plus or minus 30 degrees and preferably with an accuracy of plus or minus 20 degrees.

More specifically, in the illustrated example, the voltage VBG is a trapezoidal voltage substantially of the same form as the supply voltage φn, but in phase opposition with the supply voltage φn. More specifically, in this example, during the phase P1 of the voltage φn, the voltage VBG decreases in a linear fashion from its high value VBGH until its low value VBGL. During the phase P2 of the voltage φn, the voltage VBG remains substantially constant and equal to its low value VBGL. During the phase P3 of the voltage φn, the voltage VBG increases in a linear fashion from its low value VBGL until its high value VBGH. During the phase P4 of the voltage φn, the voltage VBG remains substantially constant and equal to its high value VBGH. As a result, during the phase P1 of the voltage φn, the threshold voltage VTH of the transistor T1 increases in a linear fashion from its low value VTHMIN until its high value VTHMAX. During the phase P2 of the voltage φn, the voltage VTH remains substantially constant and equal to its high value VTHMAX. During the phase P3 of the voltage φn, the voltage VTH decreases in a linear fashion from its high value VTHMAX until its low value VTHMIN. During the phase P4 of the voltage φn, the voltage VTH remains substantially constant and equal to its low value VTHMIN.

An advantage of the cell 400 shown in FIG. 4 is that the threshold voltage of the transistor T1 can be rendered low, for example lower than 0.1 volt, or zero, at the end of the phase P3 of the supply voltage φn, and relatively high, for example greater than 0.3 volt, during the phase P2 of the supply voltage φn. This makes it possible to satisfy the two contradictory objectives of reducing the non-adiabatic energy dissipation of the cell during the phase P3, and reducing the static consumption linked to the leakages in the transistor T1 during the phase P2.

By inverting the types of conductivity of the transistors T1, an inverting cell is obtained, i.e. one that performs the NO logic function. More generally, all basic logic functions conventionally used in integrated circuits, for example the functions AND, OR, NO AND NO OR, can be performed by cells having architectures of the same type as the one shown in FIG. 4, i.e. comprising one or more dual-gate field-effect transistors coupled in series and/or in parallel between a supply node a1 of the cell and an output node s1 of the cell, each transistor having its front gate (fg) coupled to a node for applying an input logic signal of the cell and its back gate (bg) coupled to a node for applying a periodic variable bias voltage of the same frequency as the supply voltage of the cell.

Figure 7:
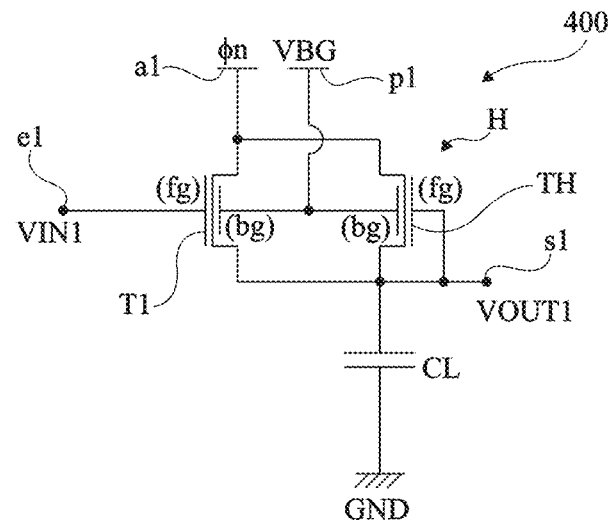
FIG. 7 is a circuit diagram depicting in greater detail an example embodiment of the cell shown in FIG. 4.

FIG. 7 is a circuit diagram depicting in greater detail an example embodiment of the cell 400 shown in FIG. 4. FIG. 7 shows the same elements as FIG. 4, and depicts more specifically an example embodiment of the maintaining circuit H of the cell 400 shown in FIG. 4.

In the example shown in FIG. 7, the maintaining circuit H is constituted by a MOS transistor TH coupling, via its conduction nodes, the output node s1 of the cell to its supply node a1, the control gate of the transistor TH being coupled to the output node s1 of the cell. In the example shown in FIG. 7, the transistor TH is a transistor of the same type of conductivity as the transistor T1, i.e. N-channel in the example in question. In this example, the source of the transistor TH is coupled, for example connected, to the node s1, and the drain of the transistor TH is coupled, for example connected, to the node a1. In this example, the transistor TH is a dual-gate transistor the front gate (fg) of which is coupled, for example connected, to the node s1, and the back gate of which is coupled, for example connected, to the node p1.

When the input voltage VIN1 returns to its low value following a high-level impulse (phase P3 of the voltage VIN1, corresponding to the phase P2 of the voltages φn and VOUT1), the transistor TH replaces the transistor T1 in order to maintain the voltage VOUT1 at a high level.

More generally, any other circuit can be used to replace the circuit H shown in FIG. 7 by means of which it is possible to maintain, between the terminals a1 and s1, during the phase of decline of the high-level impulse of the input voltage VIN1 of the cell (phase P3 of the voltage VIN1), a relatively low resistance compared to the off state of the transistor T1.

Figure 8:
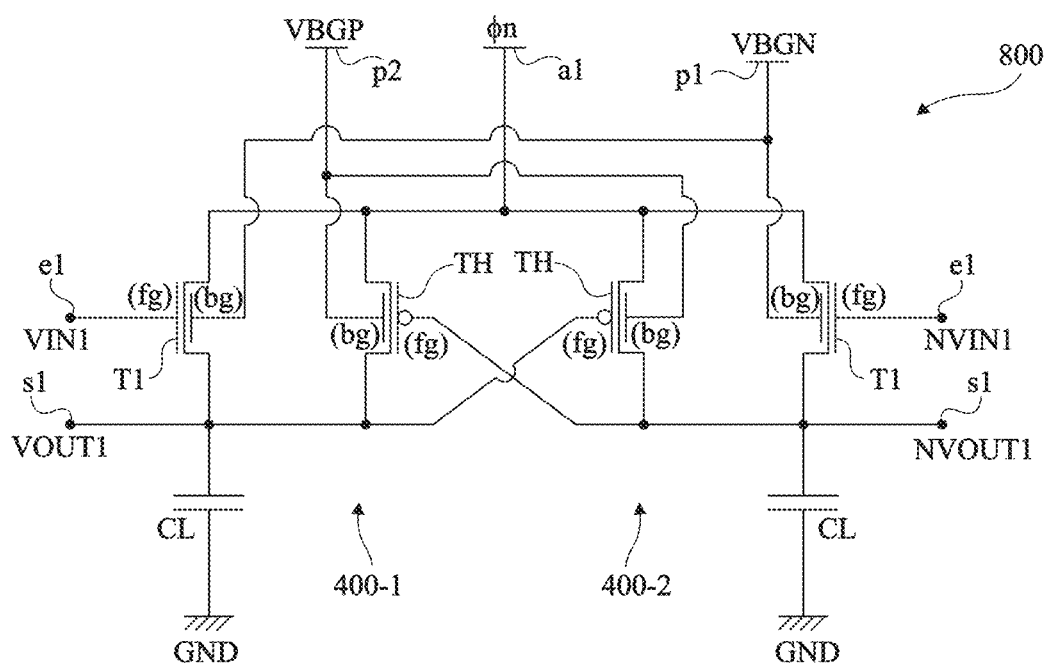
FIG. 8 is a circuit diagram of a further example embodiment of an adiabatic logic cell according to an embodiment.

FIG. 8 is a circuit diagram depicting a further example of an embodiment of an elementary cell 800 in adiabatic logic. FIG. 8 depicts more specifically a further example embodiment of the maintaining function, by coupling in parallel two identical logic cells receiving complementary input logic signals. In the example shown in FIG. 8, the cell 800 is a buffer/inverting cell.

The cell 800 of FIG. 8 comprises two buffer cells 400_1 and 400_2. The cells 400_1 and 400_2 are identical or similar to the cell 400 shown in FIG. 7, with the exception that:

in each of the cells 400_1 and 400_2, the transistor TH of the maintaining circuit is of a conductivity type opposite to the transistor T1 of the cell, i.e. of the p type in this example;

in the cell 400_1, the front gate (fg) of the transistor TH is coupled, not to the output terminal s1 of the cell 400_1, but rather to the output terminal s1 of the cell 400_2;

in the cell 400_2, the front gate (fg) of the transistor TH is coupled, not to the output terminal s1 of the cell 400_2, but rather to the output terminal s1 of the cell 400_1; and in each of the cells 400_1 and 400_2, the back gate (bg) of the transistor TH is coupled, not to the node p1, but rather to a node p2 for applying a variable bias voltage separate from the variable bias voltage applied on the node p1.

The cells 400_1 and 400_2 receive the same supply voltage φn on their respective supply terminals a1, and have their nodes GND connected to a same node for applying a reference potential. During operation, the input terminal e1 of the cell 400_1 receives an input voltage VIN1 representative of an input logic signal IN1 of the cell 800, and the input terminal e1 of the cell 400_2 receives an input voltage NVIN1 representative of a logic signal NIN1 complementary to the signal IN1. A periodic variable bias voltage VBGN of the same frequency as the supply voltage φn, for example identical or similar to the voltage VBG of the examples shown in FIGS. 4 to 7, is applied on the bias node p1 of the cell. A periodic variable bias voltage VBGP identical or similar to, but in phase opposition with the voltage VBGN, is applied on the bias node p2 of the cell.

The cell 800 provides, on the output terminal s1 of the cell 400_1, a logic signal OUT1 (in the form of a periodic variable voltage VOUT1) having the same logic state as the signal IN1, and, on the output terminal s1 of the cell 400_2, a logic signal NOUT1 (in the form of a periodic variable voltage NVOUT1) complementary to the signal IN1.

Figure 9:
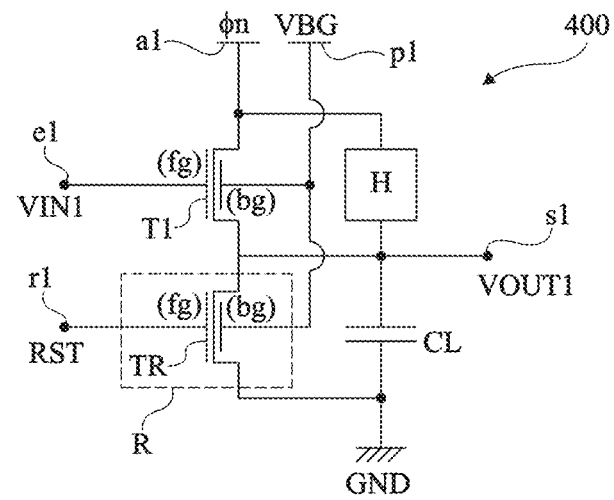
FIG. 9 is a circuit diagram of a variant embodiment of the cell shown in FIG. 4.

FIG. 9 is a circuit diagram of a variant embodiment of the buffer cell 400 shown in FIG. 4.

In the example shown in FIG. 9, the cell 400 further comprises a restarting circuit R by means of which it is possible to restart the floating output node s1 of the cell at a reference potential. In this example, the restarting circuit R comprises a MOS transistor TR coupling, via its conduction nodes, the node s1 to the node GND, the control gate of the transistor TR being coupled to a node r1 for applying a restart control signal RST for restarting the cell. The transistor TR has, for example, the same type of conductivity as the transistor T1. The dimensions of the transistor TR can be different from those of the transistor T1. The dimensions of the transistor TR can in particular be smaller than those of the transistor T1 inasmuch as the transistor TR solely serves the purpose of evacuating possible residual electrical charges accumulated on the node s1.

In the illustrated example, the transistor TR has its source coupled, for example connected, to the node GND and its drain coupled, for example connected, to the node s1. In this example, the transistor TR is a dual-gate MOS transistor, the front gate (fg) of the transistor TR being coupled, for example connected, to the node r1 and the back gate (bg) of the transistor TR being coupled, for example connected, to the node p1.

Figure 10:
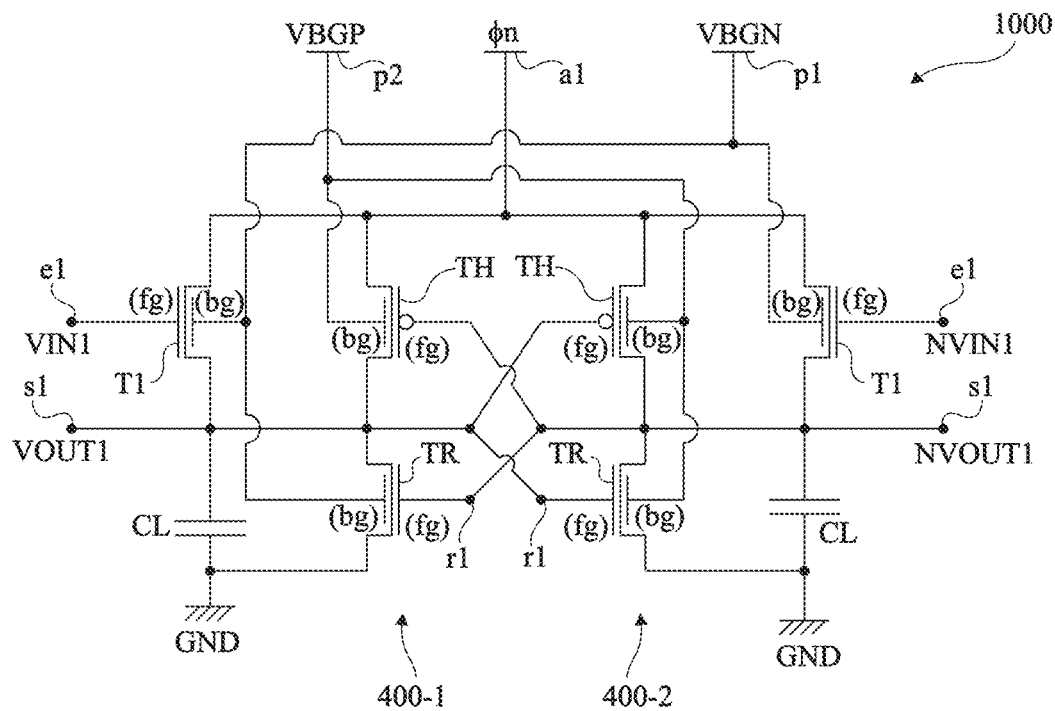
FIG. 10 is a circuit diagram of a further example embodiment of an adiabatic logic cell according to an embodiment.

FIG. 10 depicts an example of an embodiment of an elementary cell 1000 in adiabatic logic.

The cell 1000 combines the variant embodiments of FIGS. 8 and 9. More specifically, the cell 1000 comprises the same elements as the cell 800 shown in FIG. 8, and further comprises, in each of the cells 400_1 and 400_2, a restarting transistor TR, arranged in a manner identical or similar to what was described in the example of FIG. 9.

In this example, the control node r1 of the restarting transistor TR of the cell 400_1 is coupled, preferably connected, to the output node s1 of the cell 400_2, and the control node r1 of the restarting circuit TR of the cell 400_2 is coupled, preferably connected, to the output node s1 of the cell 400_1. This allows the output node s1 of the cell 400_1 and the output node s1 of the cell 400_2 to be restarted at each period of the supply signal φn.

Elementary cells for an adiabatic logic circuit have been described that are compatible with an embodiment of the type described in relation to FIG. 3, by means of which it is possible to cascade in series an unlimited number of cells by using four supply/clock signals φ1, φ2, φ3 and φ4 that are out of phase in pairs by 90 degrees. The described embodiments are, however, not limited to this particular embodiment. As a variant, it is possible to provide a logic circuit functioning with a so-called retractable supply/clock architecture, also known as Bennett clocking architecture.

Figure 11:
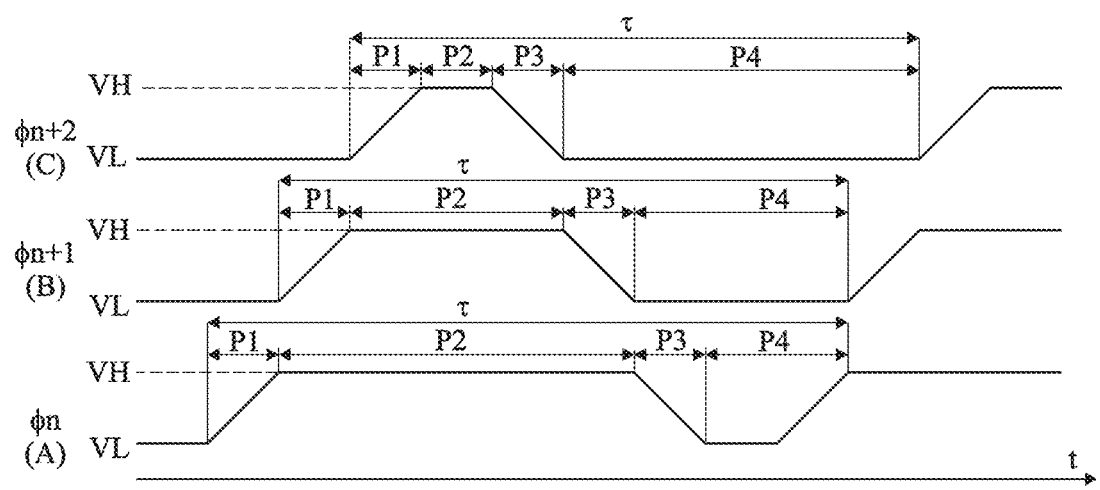
FIG. 11 is a time chart depicting a further example of an embodiment of an adiabatic logic cell according to an embodiment.

FIG. 11 is a time chart depicting an example embodiment of a Bennett clocking logic circuit. Considered in this example is a circuit comprising three cells A, B and C, for example of the type described above, cascaded in series. More specifically, the cell A, called rank n, has an output terminal coupled, for example connected, to an input terminal of the cell B, called rank n+1, and the cell B has an output terminal coupled, for example connected, to an input terminal of the cell C, called rank n+2. The cell A receives on its supply terminal a1 a supply voltage φn, the cell B receives on its supply terminal a1 a supply voltage φn+1, and the cell C receives on its supply terminal a2 a voltage φn+2. The voltages φn, φn+1 and φn+2 are illustrated in FIG. 11.

Each of the voltages φn, φn+1 and φn+2 varies in a periodic manner between a low value VL and a high value VH. As is evident from FIG. 11, the voltages φn, φn+1 and φn+2 have substantially the same period π However, the voltages φn, φn+1 and φn+2 do not have the same duty cycle. In this example, the rising time from the low value VL to the high value VH (phase P1) and the falling time from the high value VH to the low value VL (phase P3) is substantially the same for each of the voltages φn, φn+1 and φn+2. However, the time of maintenance of the supply voltage (phase P2) at the high level VH is greater for the voltage φn than for the voltage φn+1 and greater for the voltage φn+1 than for the voltage φn+2. More specifically, the phase P2 of the voltage φn starts at the beginning of the phase P1 of the voltage φn+1 and ends at the end of the phase P3 of the voltage φn+1, and the phase P2 of the voltage φn+1 starts at the beginning of the phase P1 of the voltage φn+2 and ends at the end of the phase P3 of the voltage φn+2. Conversely, the holding time of the supply voltage at the low level VL (phase P4) is less for the voltage φn than for the voltage φn+1 and less for the voltage φn+1 than for the voltage φn+2. More specifically, the phase P4 of the voltage φn+2 starts at the beginning of the phase P3 of the voltage φn+1 and ends at the end of the following phase P1 of the voltage φn+1, and the phase P4 of the voltage φn+1 starts at the beginning of the phase P3 of the voltage φn+2 and ends at the end of the following phase P1 of the voltage φn+2.

In this embodiment, the number of logic cells potentially being cascaded in series is limited by the number of available nested supply voltages φn. However, an advantage is that the maintaining circuits H of the logic cells described in the foregoing can be omitted.

Various embodiments and variants have been described. Those skilled in the art will understand that certain features of these embodiments can be combined and other variants will readily occur to those skilled in the art. In particular example embodiments have been described above in which the variable bias voltages VBG, VBGN, VBGP applied on the back gates of the transistors are provided by voltage sources separate from the supply voltage source φn (for example, in FIG. 4, the node p1 is separate from the node a1). This is linked to the fact that the variable bias voltages VBG, VBGN, VBGP, despite having substantially the same frequency and the same form as the supply voltage φn, can have high and low levels different from the high and low levels of the voltage φn. However, in certain cases, depending on the type of transistor used, the supply voltage φn will be able to be applied directly on the back gates of the transistors in order to achieve the desired effect, thus allowing a reduction of the number of periodic variable voltage sources of the circuit.

What is claimed is:

1. An adiabatic logic cell comprising a first MOS transistor coupling a node for applying a periodic variable supply voltage of the cell to a floating node for providing an output logic signal of the cell, wherein the first MOS transistor is a dual-gate transistor comprising a front gate coupled to a node for applying an input logic signal of the cell, and a back gate coupled to a node for applying a first periodic variable bias voltage, wherein the periodic variable bias voltage and the periodic variable supply voltage have substantially the same frequency and the same form.

2. The logic cell according to claim 1, wherein the periodic variable bias voltage varies substantially in phase or in phase opposition with the periodic variable supply voltage.

3. The logic cell according to claim 1, wherein the periodic variable bias voltage is chosen so that the first MOS transistor has a threshold voltage that varies in a periodic manner, substantially at the same frequency as the periodic variable supply voltage, and has a maximum value when the periodic variable supply voltage has a maximum value, and a minimum value when the periodic variable supply voltage has a minimum value.

4. The logic cell according to claim 1, further comprising a maintaining circuit connected between the node for applying the supply voltage and the floating node of the cell.

5. The logic cell according to claim 4, wherein the maintaining circuit comprises a MOS transistor coupling, via its conduction nodes, the supply-voltage node to the floating node of the cell.

6. The logic cell according to claim 5, further comprising an additional first MOS transistor coupling the supply-voltage node to an additional floating node for providing a complementary output logic signal of the cell, wherein the additional first MOS transistor is a dual-gate transistor comprising a front gate coupled to a node for applying a complementary input logic signal of the cell, and a back gate coupled to the node for applying the first bias voltage for biasing the cell, further comprising an additional maintaining circuit, the additional maintaining circuit comprising a MOS transistor coupling, via its conduction nodes, the supply-voltage node to the additional floating node of the cell, wherein the MOS transistor of the maintaining circuit has a front gate connected to the additional floating node of the cell and the MOS transistor of the additional maintaining circuit has a front gate connected to the floating node of the cell.

7. The logic cell according to claim 6, wherein the first MOS transistor and the additional first MOS transistor of the cell have the same conductivity type, and wherein the MOS transistor of the maintaining circuit and the MOS transistor of the additional maintaining circuit have a conductivity type opposite that of the first MOS transistor and the additional first MOS transistor.

8. The logic cell according to claim 7, wherein the MOS transistor of the maintaining circuit and the MOS transistor of the additional maintaining circuit are dual-gate transistors having a back gate coupled to a node for applying a second periodic variable bias voltage.

9. The logic cell according to claim 1, further comprising a restarting circuit connected between the floating node and a node for applying a reference potential of the cell.

10. The logic cell according to claim 9, wherein the restarting circuit comprises a MOS transistor coupling, via its conduction nodes, the floating node to the node for applying the reference potential of the cell.

11. The logic cell according to claim 10, further comprising an additional first MOS transistor coupling the supply-voltage node to an additional floating node for providing a complementary output logic signal of the cell, wherein the additional first MOS transistor is a dual-gate transistor comprising a front gate coupled to a node for applying a complementary input logic signal of the cell, and a back gate coupled to the node for applying the first bias voltage for biasing the cell, further comprising an additional restarting circuit, the additional restarting circuit comprising a MOS transistor coupling, via its conduction nodes, the additional floating node to the node for applying the reference potential of the cell, wherein the MOS transistor of the restarting circuit has a front gate connected to the additional floating node of the cell and the MOS transistor of the additional restarting circuit has a front gate connected to the floating node of the cell.

12. The logic cell according to claim 11, wherein the MOS transistor of the restarting circuit and the MOS transistor of the additional restarting circuit are dual-gate transistors each having a back gate coupled to the node for applying the first bias voltage for biasing the cell.

13. The logic cell according to claim 1, further comprising an additional first MOS transistor coupling the supply-voltage node to an additional floating node for providing a complementary output logic signal of the cell, wherein the additional first MOS transistor is a dual-gate transistor comprising a front gate coupled to a node for applying a complementary input logic signal of the cell, and a back gate coupled to the node for applying the first bias voltage for biasing the cell.

14. The logic cell according to claim 13, further comprising a maintaining circuit, the maintaining circuit comprising a MOS transistor coupling, via its conduction nodes, the supply-voltage node to the additional floating node of the cell.

15. The logic cell according to claim 13, further comprising a restarting circuit, the restarting circuit comprising a MOS transistor coupling, via its conduction nodes, the additional floating node to the node for applying the reference potential of the cell.

16. A logic circuit comprising a first logic cell according to claim 1 and a second logic cell according to claim 1 cascaded in series with the first cell, the first cell having its floating node connected to the node for applying the input logic signal of the second cell.

17. An adiabatic logic cell comprising a first MOS transistor coupling a node for applying a periodic variable supply voltage of the cell to a floating node for providing an output logic signal of the cell, wherein the first MOS transistor is a dual-gate transistor comprising a front gate coupled to a node for applying an input logic signal of the cell, and a back gate coupled to a node for applying a first periodic variable bias voltage, wherein the periodic variable bias voltage is chosen so that the first MOS transistor has a threshold voltage that varies in a periodic manner, substantially at the same frequency as the periodic variable supply voltage, and has a maximum value when the periodic variable supply voltage has a maximum value, and a minimum value when the periodic variable supply voltage has a minimum value.

* * * * *